United States Patent

Knudsen et al.

[11] Patent Number: 4,725,504
[45] Date of Patent: Feb. 16, 1988

[54] METAL COATED LAMINATE PRODUCTS MADE FROM TEXTURED POLYIMIDE FILM

[75] Inventors: Philip D. Knudsen, South Berwick, Me.; Daniel P. Walsh, Peabody, Mass.

[73] Assignee: Polyonics Corporation, Newburyport, Mass.

[21] Appl. No.: 18,346

[22] Filed: Feb. 24, 1987

[51] Int. Cl.⁴ .............................................. B32B 15/08
[52] U.S. Cl. ................................... 428/458; 428/671; 428/675; 428/678; 428/473.5
[58] Field of Search ............... 428/671, 675, 678, 458, 428/473.5

[56] References Cited

U.S. PATENT DOCUMENTS

| | | | |
|---|---|---|---|
| 3,011,920 | 12/1961 | Shipley, Jr. | 117/213 |
| 3,062,666 | 11/1962 | McLeod et al. | 106/1 |
| 3,140,188 | 7/1964 | Zirngieble et al. | 106/1 |
| 3,179,614 | 4/1965 | Edwards | 260/30.2 |
| 3,179,634 | 4/1965 | Edwards | 260/78 |
| 3,338,726 | 8/1967 | Berzins | 106/1 |
| 3,531,301 | 9/1970 | Watson | 106/1 |
| 3,537,878 | 11/1970 | Baudrand et al. | 117/47 |
| 3,562,038 | 2/1971 | Shipley, Jr. et al. | 156/3 |
| 3,573,973 | 4/1971 | Drotar et al. | 117/212 |
| 3,682,960 | 8/1972 | Haller | 260/32.6 |
| 3,767,538 | 11/1973 | Politycki et al. | 204/30 |
| 3,791,848 | 2/1974 | DeAngelo | 117/47 |
| 3,821,016 | 6/1974 | DeAngelo | 117/47 |
| 3,954,570 | 5/1976 | Shirk et al. | 204/15 |
| 4,078,096 | 3/1978 | Redmond et al. | 427/98 |
| 4,148,969 | 4/1979 | Henderson | 428/458 |
| 4,297,397 | 10/1981 | Feldstein | 427/304 |
| 4,496,794 | 1/1985 | Darms et al. | 174/68.5 |
| 4,503,112 | 3/1985 | Konicek | 428/675 |

FOREIGN PATENT DOCUMENTS

| | | | |
|---|---|---|---|
| 0116297 | 8/1984 | European Pat. Off. | 428/473.5 |
| 2939236 | 4/1981 | Fed. Rep. of Germany | 428/473.5 |
| 0135840 | 11/1978 | Japan | 428/473.5 |
| 0139978 | 10/1979 | Japan | 428/473.5 |
| 0187847 | 10/1984 | Japan | 428/458 |

OTHER PUBLICATIONS

D. J. Levy and D. H. Ma, "Interfacial Bonding of Nickel to Polyamideimide", Plating and Surface Finishing, Jun. 1979, 68–71.

L. E. Perrins, "The Mechanism for the Adhesion of Electroplate to Propylene Copolymer", Transaction of the Institute of Metal Finishing, 1972, vol. 50, 38–45.

James H. Brewer, "Applications of Additive Circuitry", IPC Meeting, Sep. 1974, 1–9.

Primary Examiner—Marion C. McCamish
Assistant Examiner—C. Buczek
Attorney, Agent, or Firm—Paul J. Cook

[57] ABSTRACT

One or both surfaces of a uniformly and completely textured polyimide sheet are coated with a layer of electroless nickel or cobalt and a subsequent layer of electrolytically applied copper yielding an adhesiveless laminate useful in the production of electronic circuitry. The copper and nickel or cobalt layers are strongly bonded to the textured polyimide sheet to the extent that the laminate exceeds bond strength requirements as measured by current standard peel strength tests of the Institute for Interconnecting and Packaging Electronic Circuits (IPC) for both initial and post solder float adhesion.

9 Claims, 8 Drawing Figures

METAL COATED LAMINATE PRODUCTS MADE FROM TEXTURED POLYIMIDE FILM

BACKGROUND OF THE INVENTION

This invention relates to a process for coating one or both surfaces of a polyimide sheet with electrolessly deposited nickel or cobalt and electrolytically deposited copper, to the laminate products obtained by the process and to the textured polyimide which forms the base layer for the laminates.

Certain electronic assemblies have conductor traces on both sides of a dielectric substrate. Preferred dielectrics for applications requiring flexible substrates, especially in multilayer constructions, involve the use of polyimide films. In general practice the conductive layers on this substrate are provided through the use of metal foils and adhesives specially formulated for their physical and thermal stability. The conductive layers are also provided in some cases through direct metalization by sputtering or by electroless deposition involving methods well known to those versed in the art.

Currently their are no commercially available polyimide laminate materials, produced in the absence of an adhesive, suitable for IPC Class 3 electronic circuit applications. The adhesive bonding method has certain disadvantages especially in critical service and multilayer applications, where either properties of the adhesive or the physical space occupied by the adhesive are limiting factors. For example, these adhesive-bonded laminate materials exhibit poor dimensional stability, a severe disadvantage for laying up multilayer boards. The preferred construction (especially in multilayer applications) would avoid the use of adhesives and provide the metal directly bonded to the substrate. Until the present invention, however, the methods available for direct metalization of polyimide film substrates had more significant drawbacks than the adhesive bonding methods.

Two methods for preparing polyimide adhesiveless metal coated laminates are the related methods of vacuum and sputter deposition, followed by electrolytic copper buildup to desired thicknesses. Sputtering provides better adhesion than vapor deposition, but neither technique provides physical properties adequate for critical service applications. Several commercially available single-sided materials are produced by these methods. The adhesion values obtained on subsequent copper buildup to greater than 25 $\mu$m are very low for materials with sputtered copper. One structure has an initial chromium layer sputtered to the polyimide film which is then covered with a sputtered layer of copper. A disadvantage of this construction is that chromium is not removed during subtractive processing of electronic traces using standard etchants designed to remove copper.

An alternative method for preparing a polyimide adhesiveless metal clad laminate is to cast a liquid solution of a polyamic acid onto the surface of a metal foil, and then to heat the entire composition to a temperature which will imidize the polyamic acid and form a polyimide or amide modified polyimide film. Several modifications of this basic technique are disclosed in U.S. Pat. Nos. 3,682,960; 4,148,969; and 4,496,794. At present, laminates produced by this technique have limited application areas due to their poor dimensional stability. This method is also limited by the availability of suitable foil thicknesses.

In order to provide an adherent metal layer or layers to a polyimide film substrate by chemical metal deposition, several basic procedures are employed. Since processing is done in aqueous solutions, the surface of the polyimide film must be rendered hydrophilic to facilitate uniform adsorption of the catalyst used for seeding the electroless metal deposition. Commonly referred to as etching, this treatment also serves to microetch the surface of the polyimide, thus providing a mechanical interlock between the polyimide and metal layer. This surface preparative step will be referred to herein as texturing for purposes of this application to avoid confusion with the removal of unwanted metal during circuit preparation which also is referred to as etching in the printed circuit industry.

U.S. Pat. Nos. 3,791,848 and 3,821,016 to DeAngelo disclose an aqueous ethylenediamine composition wherein the diamine is present in an amount in excess of its degree of solubility, thereby forming a two-phase system. The preferred aqueous basic compounds are disclosed as the hydroxides of the alkali metals including sodium, potassium, lithium, rubidium, and cesium. The examples are specifically directed to texturing with sodium hydroxide in very strong solution containing the ethylenediamine in suspension so as to yield a pitted surface on the polyimide. Since a two-phase system is utilized, the polyimide surface tends to be non-uniformly and incompletely textured. The degree of texturing for a given portion of the surface depends upon which phase of the solution a portion of the surface is primarily exposed. These non-uniformities result in subsequent non-uniform deposition of catalyst and electroless metal and in a rough irregular appearance of the final metal coated film.

U.S. Pat. No. 3,767,538 to Politycki et al, describes an attempt to produce a well-adherent double-sided laminate on polyimide film. The film surface is roughened by a fresh mixture of sulfuric and hydrochloric acids or by mechanical impingement of sand on the surface and, if needed, a further sodium hydroxide treatment may be employed. The polyimide film is then heated to expel water then seeded for metalization in a colloidal palladium bath. After this, an electrically conductive, water-vapor permeable continuous layer of silver is deposited by electroless deposition and the film is heated at 150° C. to expel water. Finally, a layer of copper is electrolytically deposited to form the laminate structure. No specific adhesion values are reported for the laminate produced by this method.

A high speed additive circuit process on a polyimide substrate using electroless nickel for metalization (no etching of metal required) is described in U.S. Pat. No. 3,573,973 to Drotar et al. The basic process steps are: preparing the substrate, catalyzing, printing a mask, heat setting of the masking ink, electroless plating of a nickel/phosphorous alloy, heating at 195° C. to improve metal to polyimide bond and then either electrolytic plating or solder coating to decrease the electrical resistance of the resultant structure. The use of a nickel/phosphorous alloy as the metalizing layer may cause difficulty etching laminates produced by this method during substractive circuit production methods. Another disadvantage of this process is the need for two heating steps, the second of which is at a very high temperature (195° C.) in order to provide the desired adhesion characteristics. The adhesion values reported are 5.0 lb./in. maximum by a nonstandard test and there is no mention of the stability of the product to solder float. The low adhesion of metal to polyimide limits the use of these laminates to specialty applications. The method of Drotar, therefore, does not provide a method for preparation of metal coated laminates for general use in the printed circuit industry.

In U.S. Pat. No. 3,954,570 to Shirk et al, another additive method is disclosed wherein the electroless deposit may be nickel. The authors cite no advantage of one metal over another in the initial metalizing step, and specifically claim a patterned flame sensitized surface which is catalyzed, preferably with tin and palladium, then electroless plated with either copper, nickel, or cobalt. The method of Shirk also provides low bond strengths, and for the nonstandard solder dip test disclosed, no advantage is stated for the use of electroless nickel rather than electroless copper or cobalt.

Another additive method for circuit preparation on a polyimide substrate is disclosed in U.S. Pat. No. 4,078,096 to Redmond et al. The method described is for texturing the surface of the polymer with a hydrazine/caustic solution, catalyzing, then plating with either electroless nickel, copper or cobalt. The method relates to the preparation of a specific circuit type by an additive process, and the maximum initial peel strength disclosed is only 4.6 lb./in. which is too low for general use in the printed circuit industry. Samples made by the method of this patent result in cohesive failure of the polyimide film at bond values of only 4.0 lb./in. using the optimum formulation of 60 percent hydrazine hydrate and 9.3 percent sodium hydroxide disclosed by Redmond in Table II. This lowering of the cohesive strength of the film is alluded to by Redmond in Column 4, lines 37-40, where the failure mode of well adhered and poorly adhered samples is discussed. Cohesive failure at such low values indicates degradation of the polymer film which is seen as ripping in the Z-axis during peel testing. There is no disclosure of completely coating one or both surfaces of a polyimide sheet with electrolessly deposited metal followed by electrolytically deposited metal.

There have been prior attempts to provide an adherent metal layer on both sides of polyimide sheets by direct metalization using electroless copper followed by electrolytic copper build-up to the desired thickness. This technique has proven unsuitable in practice since blistering of the electroless copper layer usually occurs when simultaneously applied to both sides of the film. If blistering is avoided, the peel strength of the resultant laminate is less than that for a single-sided laminate of the same metal thickness.

Perrins, in *Transactions of the Institute of Metal Finishing* (1972) Volume 50, pp. 38-45, discloses a process for electroplating propylene polymers with electroless nickel or copper followed by electrolytic plating with copper. The plating in this case is conducted on only one side of propylene copolymer plaques. The use of the nickel provides improved adhesion, especially after thermal cycling of the sample which will cause degradation of the copper bond. This process, where nickel is used as the base metal layer, has only been applied to injection molded or bulk processed polymers, but has not been extended for use on thin film substrates. Therefore, the nickel process has been restricted to use where the nickel layer is never removed but remains a permanent part of the finished article.

In "Applications of Additive Circuitry", a Technical paper presented at the Institute of Printed Circuits in September 1974, Brewer discloses a method in which nickel is deposited on both surfaces of a paper reinforced phenolic. Electroless copper is then deposited and the plated panel is heated beyond the glass transition temperature of the substrate material to improve the nickel to polymer adhesion. This method is not applicable to non-thermoplastic substrates such as polyimide films.

*Plating and Surface Finishing,* "Interfacial Bonding of Nickel to Polyamide-Imide", Vol. 66, No. 6, (June, 1979) pp. 68-71, Levy et al, describes nickel plating on a rigid polyamide-imide substrate textured with an abrasive and/or sodium or potassium hydroxide. The article relates the effect of various surface treatments on metal adhesion, and specifically to the combination of mechanical abrasion followed by a chemical treatment such as dipping in aqueous alkali metal hydroxide solutions. The article states that no advantage was observed with the use of nickel rather than copper for the initial metalization of the polymer, and concludes that the adhesion of the metal to the polyamideimide substrate is a combination of both mechanical and chemical factors related to the substrate.

Prior to the present invention, there has been no commercially viable method available for the direct coating of polyimide films with electrically conductive layers, without the use of an adhesive, exhibiting adequate properties for general use in electronic circuitry. No adhesiveless laminates with metal on both sides have been available due to the tendency for an electroless metal layer to blister during deposition onto both sides of a thin film, and to the destruction of polyimide to metal adhesion by thermal shock upon immersion in molten solder or because of undesirable reduction of film strength due to texturing. The problem of electroless metal blistering is especially acute in the complete metalization of thin polymeric film; hydrogen evolution during the deposition process has been suggested as a cause of electroless metal blistering. Electroless metal blistering on thin polymeric substrates is greatly reduced when the metal deposition is restricted to certain areas on the film (i.e. other than complete surface coverage).

It would be desirable to provide a process for coating at least one surface of a polyimide film with electrolessly deposited metal, followed by electrolytically deposited copper having sufficient adherent strength to the polyimide and sufficient resistance to thermal shock to render the resultant laminate useful for fabricating electronic circuits.

SUMMARY OF THE INVENTION

The present invention is directed to a process whereby a polyimide sheet or continuous web of uniformly and completely textured polyimide film is uniformly coated on one or both surfaces with a strongly adherent electroless nickel or cobalt layer followed by an electrolytic copper layer. Adherent layers of exposed copper are uniformly plated on one or both sides of the sheet and metal layers of controlled thickness are produced which provide laminates useful for the production of electronic circuitry. These laminate structures are suitable for general use in the production of electronic circuitry. The terms "web", "sheet" and "film" are used herein interchangeably and refer to thin flat polymer substrates.

In accordance with the present invention, there is provided a process for forming an adherent exposed copper coating on the surfaces of a polyimide sheet or film such as the type prepared from the anhydride of pyromellitic acid and 4,4'-diamino-diphenyl ether. At least one surface of a polyimide sheet is first treated with a one-phase solution of an alkali metal hydroxide, an alcohol and a diamine of the formula $H_2N(CH_2)_nNH_2$ wherein n is an integer from 2 to 6, preferably ethylenediamine, to provide a textured and hydrophilic surface, where a uniformly and completely textured surface of a particular topography is produced and the mechanical bulk properties of the film are substantially unaffected. The surface of the textured film is characterized by nodules or bumps, rather than pits as reported for other texturing methods. When viewed through a microscope the completeness of surface texturing is readily seen. Photomicrographs of the film textured by the methods of U.S. Pat. Nos. 3,791,848 and 4,078,096 to DeAngelo and Redmond respectively, are shown compared to the film textured by the method of this invention in FIGS. 5, 6 and 7. The substantially complete texturing produced by this method can be seen by the more pronounced and uniform scattering of the light, as compared to the film produced by either of the other methods which are darker in appearance and therefore not as completely textured.

The surface of the film is rendered uniformly frosted and matte with a translucent appearance so that a surface receptive to colloidal catalyzation and the subsequent electroless deposition of an electrically conductive metal layer is provided, yet the original mechanical bulk properties of the film are substantially unaffected. The resulting uniformly and completely textured surface of the polyimide film is contacted with colloidal palladium in order to provide a catalytic surface for the deposition of electroless nickel or cobalt. Nickel or cobalt is then deposited on the receptive surfaces by electroless deposition to form a hydrogen gas and water vapor permeable layer which is electrically conductive. No high temperature baking of the film is necessary before the step of electrolytic buildup with copper. As used herein, the term "nickel", as it relates to the initial metal layer, includes nickel metal or a nickel containing alloy. Also as used herein, the term "cobalt", as it relates to the initial metal layer includes cobalt metal or a cobalt containing alloy. This textured film can also be useful as a substrate for the fabrication of adhesive-based metal clad laminates.

In accordance with this invention, laminate constructions are provided which are coated on one surface with electroless deposited nickel or cobalt and electrolytically deposited copper, the second surface being either bare polyimide (FIG. 1) or coated with electroless nickel or cobalt (FIG. 2). When tested according to IPC test 2.4.9 (July 1985 update), these laminates are characterized by peel strengths of at least 6.0 lb./in. and usually greater than about 7.0 lb./in. by Method A and 4.5 lb./in. by Method C. These laminates also pass IPC test 2.4.13 (December 1982 update). All test methods referred to herein are from IPC TM 650, and are performed using laminates that have been coated with metal to a thickness of 35 μm. These are test methods normally used by circuit manufacturers to determine laminate material quality. When the electroless nickel or cobalt thickness is greater than about 1.0 μm with either of these two constructions, adhesion values of at least 5.0 lb./in. and usually greater than 6.0 lb./in. can be obtained with IPC test 2.4.9, Method C. The double-sided construction passes a more rigorous modification of IPC test 2.4.13 where metal remains on both sides of the sample. Prior to this present invention, no double-sided laminate, apart from adhesive-based laminates, were capable of passing this more stringent test.

The textured film produced by the texturant outlined above, and the subsequent use of nickel or cobalt metalization in a unique two-step sequence, yields a superior laminate. The combination of these two steps unexpectedly provides enhanced solder float resistance, which is not obtained by the use of nickel metalization alone, as shown in Example 3 of this application.

In another aspect of this invention, a laminate construction is provided which is coated on both surfaces with electroless nickel or cobalt and electrolytic copper (FIG. 3), and has a peel strength of at least 6.0 lb./in. and usually greater than 7.0 lb./in. by IPC test 2.4.9, Method A, and at least 4.5 lb./in. by IPC test 2.4.9, Method C. When the electroless nickel or cobalt thickness is greater than about 1.0 μm on this double-sided laminate construction, adhesion values are greater than 6.0 lb./in. by IPC test 2.4.9, Method C.

DESCRIPTION OF THE SPECIFIC EMBODIMENTS

Figure 1:
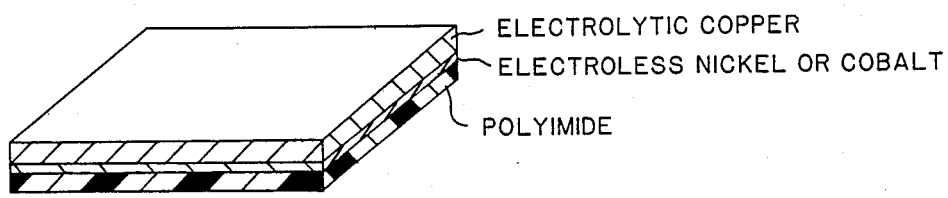
FIG. 1 shows the embodiment of this invention coated on one side with nickel and copper.
Figure 2:
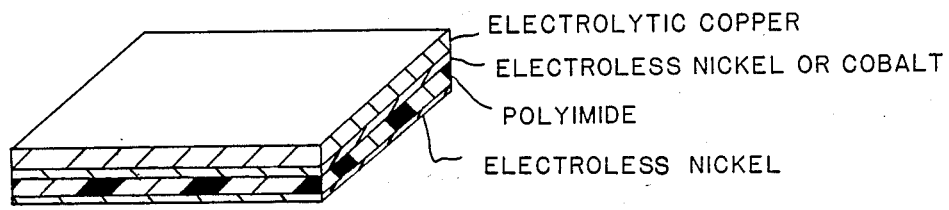
FIG. 2 shows the embodiment of this invention coated on both sides with nickel and on only one side with copper.

In the preferred embodiment of this invention, the polyimide surfaces treated are of the type prepared from a polyamide-acid (also referred to as polyamic acid) which has the formula:

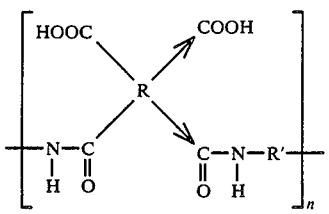

where the arrows denote isomerism, R is an organic tetravalent radical containing at least two carbon atoms, no more than two carbonyl groups of each polyamic acid unit being attached to any one carbon atom of said tetravalent radical; R' is a divalent radical containing at least two carbon atoms, the amide groups of adjacent polyamide-acid units attached to separate carbon atoms of divalent radical and n is a positive integer sufficient to provide the polyamic acid with an inherent viscosity of at least 0.1. The most preferred of such polyimides is Kapton (Trademark registered to DuPont) which is the polyimide formed from pyromellitic anhydride,

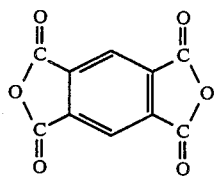

and 4,4'-diamino-diphenyl ether,

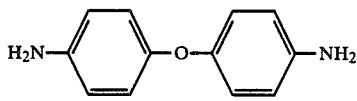

and having the general formula:

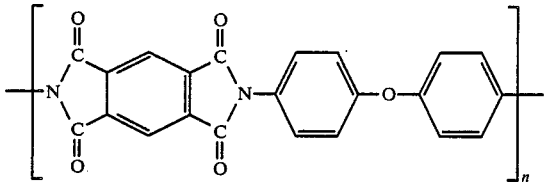

where n is an integer ranging from 150 to 650 and which has an average molecular weight of 60,000 to 250,000. The above polyimides and their preparation are described in U.S. Pat. Nos. 3,179,614 and 3,179,634 to Edwards, which are incorporated herein by reference.

The polyimide can have any thickness suitable as a substrate for electronic circuitry, and most generally is in the form of a relatively thin sheet having a thickness of between about 12 and 125 μm. Prior to this invention, a polyimide film coated on both sides with a permanently bonded metal comprising electroless nickel followed by electrolytic copper capable of passing current IPC tests, in particular IPC tests 2.4.9 and 2.4.13, for adhesion and thermal shock, has not been achieved without the use of a separate adhesive layer. Although the preferred embodiment of this invention relates to the polyimide film described above, it is understood that with the surface preparation step of this invention, thin films produced by other modifications of a basic poly-imide structure can also provide useful laminates when processed in accordance with the method disclosed herein.

This invention also relates to a method for coating one or both sides of the textured polyimide sheet (web, film) with well adherent metal layers. These metal layers when applied according to the method disclosed herein are suitable for use in electronic circuitry, especially in applications where the use of an adhesive would be detrimental to the performance or construction of the final product. Once the metal layers are provided as disclosed, they can be further processed through means normally employed in the electronics industry, and lend themselves to both semi-additive and subtractive methods to form one or two patterned layers for circuit preparation as summarized in the following outline:

| Methods Used for Circuit Preparation | |
|---|---|
| Semi-additive Process | Subtractive Process |
| Thin Laminate (e.g., 0.5–8 um metal) | Thick Laminate (e.g., 35 um metal) |
| Resist coat | Resist coat |
| Photoimage | Photoimage |
| Develop resist | Develop resist |
| Electrolytic copper plate (e.g., 35 um) | Etch unmasked metal |
| Strip resist | Strip resist |
| Etch to remove thin laminate metals | |

No modification of existing procedures for the production of said circuitry is necessary using laminates of this invention. A further advantage for the use of the method of this invention is that metal thicknesses can be provided easily from extremely thin to very thick layers. Laminates with layers of metal less than about 18 μm (½ ounce) are difficult to produce using present adhesive laminate production methods, but are easily produced in a continuous roll-to-roll process by the method of this invention.

The polyimide film surface should be relatively clean, but a cleaning or degreasing step may be performed (if necessary) prior to contact with a suitable texturant. The texturant of this invention provides a uniformly and completely frosted or matte appearance to the surface of the film which is due to nodules remaining when surrounding material is selectively dissolved by the texturant. This texturing process is disclosed in an application entitled "Textured Polyimide Film" of Daniel P. Walsh, filed concurrently herewith. The one-phase texturing composition is comprised of an alkali metal hydroxide, a diamine of the formula $H_2N(CH_2)_nNH_2$ wherein n is an integer from 2 to 6, preferably ethylenediamine, and a water miscible alcohol such as methanol, ethanol, isopropanol or n-propanol. The alkali metal hydroxide can comprise potassium hydroxide, sodium hydroxide, lithium hydroxide or mixture thereof, with potassium hydroxide being preferred. In addition, quaternary ammonium hydroxides such as tetramethylammonium hydroxide, can be used. The concentration of the diamine in the texturing solution is sufficient to effect the desired surface modification without forming a two phase liquid composition and is between about 3 and 15 percent by weight. Suitable compositions range between 15 and 40 percent by weight alkali metal hydroxide, 3 to 15 percent by weight diamine, and 10 to 50 percent by weight of an alcohol or mixture of alcohols one of whose functions is to act as a cosolvent and provide a one-phase solution; the balance of the mixture is water. The particular percentage of each component in the texturant is adjusted according to the content of alkali hydroxide or diamine in order to maintain a one-phase system at the temperature used for texturing the film. As set forth above, the textured film of this invention is uniformly and completely textured.

Once the clean polyimide surface has been treated to render the surface hydrophilic, the film is catalyzed with any one of the catalyst systems well known to those versed in the art of electroless plating. Catalyst combinations which can be used in conjunction with the sensitized polyimide surface are disclosed in U.S. Pat. Nos. 3,011,920 and 3,562,038 which are incorporated herein by reference. The catalyst may be applied in a two step application, by first depositing the sensitizer and then the noble metal activator; however, these baths may be combined in a one step operation. The sample is immersed in an acidic solution to remove tin from the surface. The sample is then placed in an electroless nickel or cobalt bath to provide the desired thickness of nickel or cobalt.

Typical electroless nickel baths are shown as follows:

| | |
|---|---|
| 1. Nickel Sulfate (NiSO$_4$.6H$_2$O) | 20.0 g/l |
| Dimethylamine Borane | 3.0 g/l |
| Citric Acid | 10.0 g/l |
| Conc. HCl | 25.0 ml/l |
| Ammonium Hydroxide | to pH 7.0 |
| 2-Mercaptobenzothiazole | 0.5–2.0 mg/l |
| 65° C. | |
| 2. Nickel Chloride (NiCl$_2$.6H$_2$O) | 16.0 g/l |
| Dimethylamine Borane | 3.0 g/l |
| Sodium Citrate | 18.0 g/l |
| Glycine | 8.0 g/l |
| Bismuth Nitrate | 20.0 mg/l |
| Thiourea | 15.0 mg/l |
| pH 7.0, 65° C. | |

Nickel or cobalt is deposited on the receptive surfaces by electroless deposition to form a metal coated surface. Nickel ions are reduced in this process onto the catalytic surface to form a continuous electrically conductive layer. The electroless layer must be sufficiently thick to permit the subsequent electrolytic deposition of a uniform copper layer. Generally the electroless nickel or cobalt layer is between about 0.25 μm and 1.0 μm thick but can be thicker if desired. No substantial advantages are obtained with nickel or cobalt coatings greater than about 1.0 μm.

The use of nickel or cobalt rather than copper as an initial metal layer provides several significant advantages. In the electroless deposition of metal, a certain amount of hydrogen gas is liberated as part of the reaction. Hydrogen gas is generally considered a cause of blistering during electroless copper deposition, and blistering has been a problem associated with production of a double-sided laminate on polyimide films when electroless copper is used for initial metalization. When electroless nickel or cobalt is substituted for electroless copper, especially nickel or cobalt deposited from a borane reduced bath, the blistering is alleviated. Unexpectedly, it has been found that electroless nickel/boron alloys etch more easily than electroless nickel/phosphorous alloys when standard copper etchants such as cupric chloride are used. The nickel/boron alloy producing baths are easier to use with a continuous reel to reel process and are not as prone to catastrophic decomposition as are nickel/phosphorous alloy producing baths. These nickel/boron baths also are characterized by a greater number of metal turnovers which provides longer service life in continuous operation than nickel/phosphorous baths. It is preferred to utilize electroless nickel baths wherein the reducer for the nickel is dimethylamine borane (DMAB), since the resultant nickel coating can be subsequently etched with a common etching solution such as copper chloride. Electroless cobalt can also be deposited from a bath formulation using DMAB as a reducer and may find use as an initial metal layer. Copper and palladium are not useful as initial metal layers since they can catalyze degradation of the polyimide and lead to poor post solder float peel strength values due to thermal sensitivity of the final laminate structure.

A serious deficiency of prior adhesiveless laminates when compared to their adhesive-based counterparts is their failure when subjected to standard testing for thermal shock by IPC test 2.4.9 Method C. This thermal shock failure is characterized by catastrophic loss of bond strength after solder float. The laminates made from the present invention have superior performance when compared to presently available single-sided adhesiveless laminate structures. When tested for metal to substrate adhesion after solder float as per IPC test 2.4.9, Method C; adhesion in the 4.5 to 5.0 lb./in. range is typical. With thicker nickel metalization, values greater than 6.0 lb./in. can be obtained. When copper is used as the electroless metalizing layer rather than nickel on single-sided laminate structures, post solder float values are usually less than 3.0 lb./in., and total metal delamination (blowoff) is common. The method of this invention provides the only single- or double-sided adhesiveless laminates which provide products that pass solder float adhesion testing by IPC test 2.4.9 Method C.

The combination of proper polyimide film pretreatment and electroless bath chemistry, has provided an adhesiveless laminate superior to those presently available. A laminate with these particular properties has not heretofore been available. In particular, this invention provides a laminate with the following advantages over the prior art:

1. Single or double-sided adhesiveless laminate constructions with excellent adhesion.

2. Initial adhesion values superior to those obtained using electroless copper for both single- and double-sided laminate constructions.

3. Post solder float adhesion greater than that obtained by other methods, with no random failure or blowoff during solder float testing as per IPC test 2.4.9 or 2.4.13.

4. No high temperature drying needed between electroless and electrolytic plating steps, thus providing more rapid processing times.

5. A superior laminate provided consistently with both sheet and roll-to-roll processing of the film.

6. Laminate structures can be provided having very thin conductive layers produced at significant cost savings, and more reliably than those produced by prior methods.

7. Laminate structures with improved flex ductility when compared to the adhesive-based and adhesiveless laminates presently available.

8. Laminate structures which have improved dimensional stability when compared to adhesive-based laminates.

9. Metal coated laminates processable under conditions normally utilized for production of circuitry when a nickel/boron alloy is used for initial metalization.

The following examples illustrate the present invention and are not intented to limit the same.

EXAMPLE 1

A four inch by six inch sample of type VN200 Kapton brand polyimide film is treated to render the surface hydrophilic and textured with an aqueous alkali metal hydroxide, methanol and ethylenediamine composition. The texturing composition is comprised of 37.4 percent by weight potassium hydroxide, 10 percent by weight methanol, and 7.0 percent by weight ethylenediamine (EDA) in an aqueous solution. Total film thickness is reduced from 48 to 41 $\mu$m in the texturing process and the film has a uniformly and completely frosted appearance. This treated film is further processed on both surfaces with the following sequence:

1. 60 sec. at 25° C. in 23% solution of an aqueous acid bath sold under the tradename, Shipley Cataprep 404 available from Shipley Corp.

2. 120 sec. at 45° C. in a 3% concentration of an aqueous colloidal palladium catalyst sold under the tradename, Shipley Cataposit 44 available from Shipley Corp.

3. Rinse for 60 sec. in water 4. 180 sec. at 25° C. in a 10% solution of an acidic accelerator sold under the tradename, Shipley Accelerator 19 available from Shipley Corp.

5. Rinse for 30 sec. in water.

6. 120 sec. at 65° C. in an electroless nickel plating solution, utilizing dimethylamine borane as the reducing agent, sold under the tradename Niklad 752 from the Allied Kelite division of Witco Chemical Corp. Final nickel thickness approximates 5 $\mu$m.

7. 90 minutes at 15 amps per square foot (ASF) in a brightened copper sulfate bath containing 25 ounces per gallon of sulfuric acid, 15 ounces per gallon of copper sulfate pentahydrate, 50–70 ppm chloride ion, and 1.0% of an organic brightener sold under the tradename, Copperlume PTH-R from M&T Chemicals Co. This provides a laminate coated with about 35 $\mu$m of copper.

This sample which has been coated on both sides with electroless nickel followed by electrolytically deposited copper is then dried at 80° C. for 30 minutes. After masking with chemically resistant tape, ⅛th inch lines are revealed using a copper chloride etching solution to remove metal from unmasked areas of the sample. The tape is removed, the sample is dried, and then an Instron Model 1000 Universal Testing Instrument is used to perform 90 degree peels using IPC test 2.4.9, Method A. Average adhesion of 10.0 lb./in. is obtained and no side to side variation is observed.

EXAMPLE 2

A sample of type VN200 Kapton brand polyimide film is textured and metalized by the procedure of Example 1 and plated to a final thickness of about 35 $\mu$m of electrolytic copper on both sides. The approximate nickel thickness is 0.50 $\mu$m. The adhesion of ⅛th inch lines etched from this sample is 8–9 lb./in. The sample is then tested for adhesion after solder float as per IPC test 2.4.9, Method C. The etched lines are coated with less than 50 $\mu$m of Dow Corning high vacuum silicone grease, and floated for five seconds on molten solder which is held at 288° C. No metal blowoff is observed on the ⅛th inch traces, and the final adhesion of these heat shocked materials was 4.8 lb./in.

EXAMPLE 3

Four inch by six inch samples of type VN200 Kapton brand polyimide film are textured by the four different compositions shown in the following table, then catalyzed by the procedure described in Example 1, and then metalized with either (a) an electroless copper bath containing formaldehyde as a reducing agent and sold under the tradename Enduroplate EP-407 by Hunt Chemical Co., or (b) the Niklad 752 electroless nickel bath described earlier. The EP-407 bath is a low deposit electroless copper bath which has been found to provide the best results of copper bath formulations tested on polyimide film textured by the method of this invention.

| Texturant | Texturant compositions | | | | |
| --- | --- | --- | --- | --- | --- |
| | NaOH | KOH | EDA | CH$_3$OH | H$_2$O |
| A - * | 0.0% | 41.8% (10.5 M) | 7.0% | 0.0% | 51.2% |
| B - ** | 28.0% | 0.0% (9.1 M) | 7.0% | 0.0% | 65.0% |
| C | 0.0% | 37.4% | 7.0% | 10.0% | 45.6% |
| D | 27.7% | 0.0% | 7.0% | 10.0% | 55.3% |

\* - Texturant from Example 1D, U.S. Pat. No. 3,791,848 to DeAngelo, where 45 percent by weight potassium hydroxide is substituted for 10 N sodium hydroxide.
\*\* - Texturant from Example 1D, U.S. Pat. No. 3,791,848 to DeAngelo.
- Texturants C and D are homogeneous liquid compositions in accordance with this invention.

Figure 5:
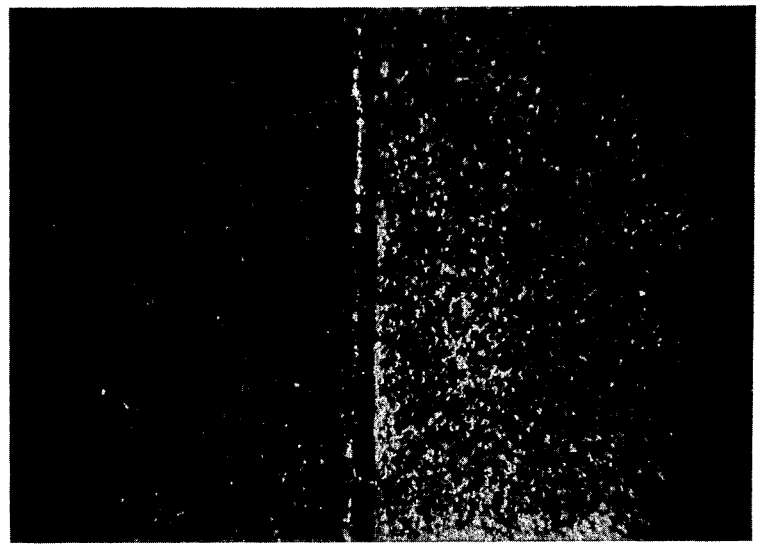
FIG. 5 is a photomicrograph, at 65X magnification, contrasting the textured film made by the method of this invention on the right half of the photomicrograph as compared to film treated by the method of DeAngelo on the left half of the photomicrograph as outlined in Example 3 of this application. (Texturant D vs. Texturant B).
Figure 7:
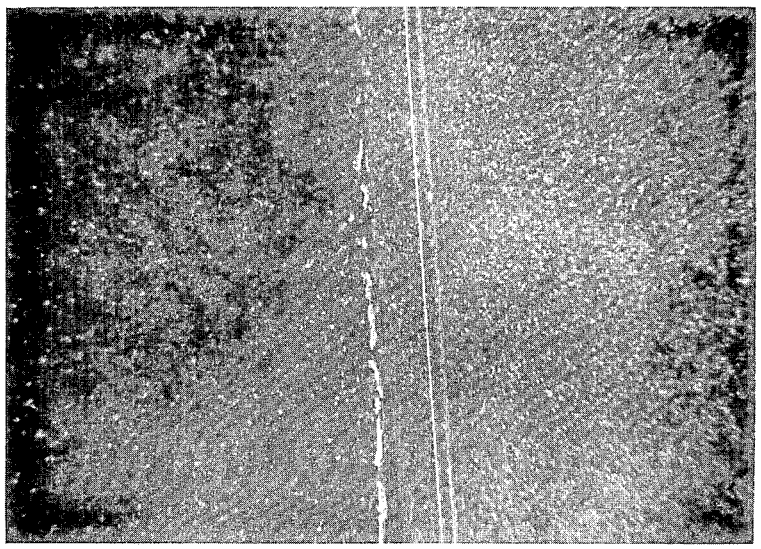
FIG. 7 is a photomicrograph, at 65X magnification, contrasting the textured film made by the method of this invention on the right half of the photomicrograph as compared to film treated by the modified method of DeAngelo (where potassium hydroxide is substituted for sodium hydroxide) on the left half of the photomicrograph as outlined in Example 3 of this application. (Texturant A vs. Texturant C)
Figure 8:
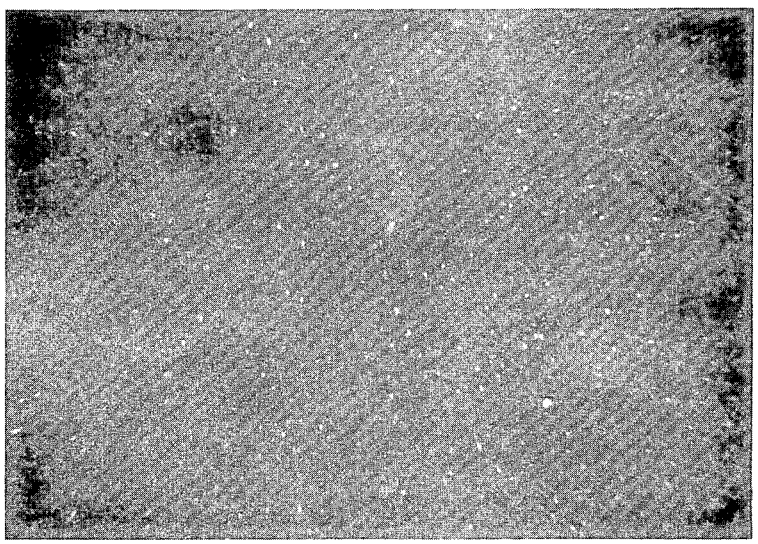
FIG. 8 is a photomicrograph at 65X magnification of untreated Type 200VN Kapton brand polyimide film which was utilized in Examples 3 and 12 of this application.

FIG. 5 shows the surfaces resulting from the use of Texturant D vs. the use of Texturant B. The darker side on the left of FIG. 5 is the surface resulting from the use of Texturant B while the lighter side on the right of FIG. 5 is the surface resulting from the use of Texturant D. The use of Texturant D results in a uniform and completely treated surface. The surface resulting from the use of Texturant B is incompletely textured as shown by the large portion of the surface which is darker. FIG. 7 shows the surfaces resulting from the use of Texturant A vs. the use of Texturant C. The darker side on the left of FIG. 7 is the surface resulting from the use of Texturant A while the lighter side on the right of FIG. 5 is the surface resulting from the use of Texturant C. The use of Texturant C results in a uniform and completely treated surface. The surface resulting from the use of Texturant A is incompletely textured as shown by the large portion of the surface which is darker. The surfaces shown in the left half of FIGS. 5 and 7 more closely resemble the surface of untreated film as shown in FIG. 8.

These samples are then electrolytically copper plated to a final metal thickness of approximately one ounce per square foot, or about 35 $\mu$m. IPC test 2.4.9, Methods A and C were then performed for initial and post solder float adhesion, respectively, with the following result:

| Sample No. | Texturant | Initial Metal | Initial Peel (lb./in.) | | Solder Float Peel (lb./in.) |
| --- | --- | --- | --- | --- | --- |
| | | | Side A | Side B | |
| 1 | A | Ni | 5.2 | 6.4 | 0–3 |
| 2 | A | Cu | 4.8 | 4.8 | Blowoff |
| 3 | B | Ni | 7.4 | 8.5 | 0–4 |
| 4 | B | Cu | 6.7 | 8.4 | Blowoff |
| 5 | C | Ni | 7.9 | 6.8 | 4.6 |
| 6 | C | Cu | 6.5 | 8.0 | Blowoff |

-continued

| Sample No. | Texturant | Initial Metal | Initial Peel (lb./in.) Side A | Initial Peel (lb./in.) Side B | Solder Float Peel (lb./in.) |
| --- | --- | --- | --- | --- | --- |
| 7 | D | Ni | 9.4 | 10.0 | 4.4 |
| 8 | D | Cu | 7.5 | 7.1 | Blowoff |

All reported adhesion values are for peels at 90 degrees for ⅛th inch traces performed using an Instron model 1000 universal tester. An average of at least three ⅛th inch traces are used for each value shown in the table above. Two major conclusions can be drawn from the information presented in the table above:

1. The homogeneous texturing solution of this invention such as that represented by Texturant C or D provides overall superior solder float performance.

2. Nickel metalization provides superior post solder float performance.

In every case the combination of either Texturant C or D, and the use of electroless nickel provides a superior laminate to that produced by the application of the two-phase texturant as taught by DeAngelo.

The samples using the nickel for electroless metalization show more consistent adhesion values which are much higher overall than those obtained with the electroless copper samples. There is no random blowoff on solder float as is found for electroless copper metalized samples.

EXAMPLE 4

Three samples of type VN200 Kapton brand polyimide film are textured and metalized as in Example 1, except that they are plated for different times with electroless nickel to provide samples of varying nickel thickness. After electrolytic copper plating to 35 μm per side in a brightened copper sulfate bath, all three samples are solder floated as in Example 3, with the following results:

| Sample No. | Electroless nickel (Niklad 752) Time | Electroless nickel (Niklad 752) Thickness | Adhesion after solder float |
| --- | --- | --- | --- |
| 1 | 2 minutes | 0.25 μm | 3-4 lb./in. |
| 2 | 5 minutes | 0.65 μm | 4-5 lb./in. |
| 3 | 10 minutes | 1.25 μm | 6-7 lb./in. |

This Example shows that the samples with the thicker nickel layers have the better post solder float adhesion. The metal thicknesses shown in this Example are easily achieved in the process of this present method on a reel to reel production basis, i.e., through a process where a continuous web of polyimide film sequentially is passed through the multiple steps of the process with intermediate washing steps between the adjacent process steps in a continuous manner.

EXAMPLE 5

A 450 foot long, 12 inch wide, roll of type VN200 Kapton brand polyimide film was processed on both surfaces by the same procedure used in Example 1, but in a continuous roll-to-roll process. In order to obtain adhesion between the electroless and electrolytic metal layers special care is taken in the design of the electroplating cell to insure that the optimum current distribution is provided to the web. After electrolytic copper buildup to 35 μm on both surfaces in a brightened copper bath, small representative samples were cut from the web for testing, and then ⅛th inch lines were revealed by tape masking and etching. The initial adhesion values obtained by IPC test 2.4.9, Method A averaged 9–10 lb./in. The adhesion values for these samples after solder float were 5.0–5.5 lb./in., as per IPC test 2.4.9, Method C.

EXAMPLE 6

A four inch by six inch sample of type VN200 Kapton brand polyimide film is prepared as in Example 1 up to the electroless nickel step, but is only plated on one side with electrolytic copper. This selective plating is accomplished by coating one side of the sample with a plating resist. The final laminate structure is comprised of double-sided electroless nickel and 35 μm of electrolytic copper on one side only. This sample is subjected to a more rigorous test than IPC test 2.4.13, "Solder Float Resistance—Flexible Printed Wiring Materials" wherein the sample is tested without removing metal from either side; the samples are cut into two-inch squares, baked at 135±10° C. for one hour; then floated for 10 seconds on solder held at 260±5° C. This sample suffers no blowoffs or delaminations.

EXAMPLE 7

A four inch by six inch sample of type VN200 Kapton brand polyimide film is backed on one side with tape, and textured as in Example 1. After pretreatment in a palladium catalyst solution, the tape is removed, followed by electroless nickel buildup, and electrolytic plating to 35 μm in a brightened acid copper sulfate bath by the method of Example 1. After plating, ⅛th inch lines are revealed using a copper chloride etchant. After removing surface moisture at 80° C. for 30 minutes, one half of the lines are peel tested for adhesion before solder float, the other half of the lines are subjected to a solder float, and then peel tested as in IPC test 2.4.9, Methods A and C yielding values of 8–9 lb./in. and 4.8 to 5.0 lb./in., respectively.

EXAMPLE 8

A four inch by six inch sample of type VN200 Kapton brand polyimide film is textured, catalyzed and accelerated as in Example 1, followed by electroless plating for two minutes in a hypophosphite-reduced nickel bath, product no. 139-500011-71, obtained from the J. E. Halma Co. This particular nickel bath provides a low phosphorous nickel alloy containing 3–5% phosphorous by weight. The sample is then plated on both sides to about 35 μm of copper in a brightened acid copper sulfate bath. It was found that this nickel deposit had a differential etch rate compared to the copper, but it is eventually removed cleanly in the unmasked areas by the use of a copper chloride etchant.

EXAMPLE 9

This Example illustrates the usefulness of the laminates produced by the method disclosed herein for the preparation of circuits by the subtractive method set forth above. Laminate constructions are prepared on type VN200 Kapton brand polyimide film using the procedure of Example 1 on one side of the film up to the point of electrolytic metalization. To prevent treatment of the other side of the film one side of the sample is masked with tape, and the tape is removed just before electroless metalization. For the preparation of a particular type of printed circuit pattern referred to as a TAB (Tape Automated Bonding) circuit (FIG. 4) which is used as a chip carrier for mounting integrated circuits (chips) by the subtractive method, the copper is only electroplated to about 17 μm in a brightened copper sulfate bath.

The laminates are first cleaned for one minute at 35° C. in a 1.0M NaOH solution containing a wetting agent, followed by cleaning for 30 seconds at 25° C. in 1.0% aqueous nitric acid, followed by thorough water rinsing and drying of the sample. The laminates are next coated with a positive liquid photoresist available from Shipley Corp. under the tradename Shipley AZ-119S. A final dry film thickness of 5 μm is obtained after drying at 80° C. for 30 minutes as per manufacturers instructions. A positive photoresist coating is a composition which becomes soluble in an aqueous developing solution on exposure to ultraviolet (UV) light energy. The resist coated laminate is then masked with a phototool and exposed using an ultraviolet exposure unit at 200 millijoules per square centimeter to image the TAB circuit pattern. The exposed resist is then developed in a two stage treatment using Shipley 303A developer from Shipley Corp. The sample is immersed for two minutes in a 25% concentration of the developer followed by 30 seconds in a 20% solution of the developer. A clean, sharp resist image of the TAB circuit pattern is obtained. The resist is then post baked to harden for one hour at 125° C. The exposed copper and underlying electroless nickel is removed in a copper chloride etchant.

Figure 4:
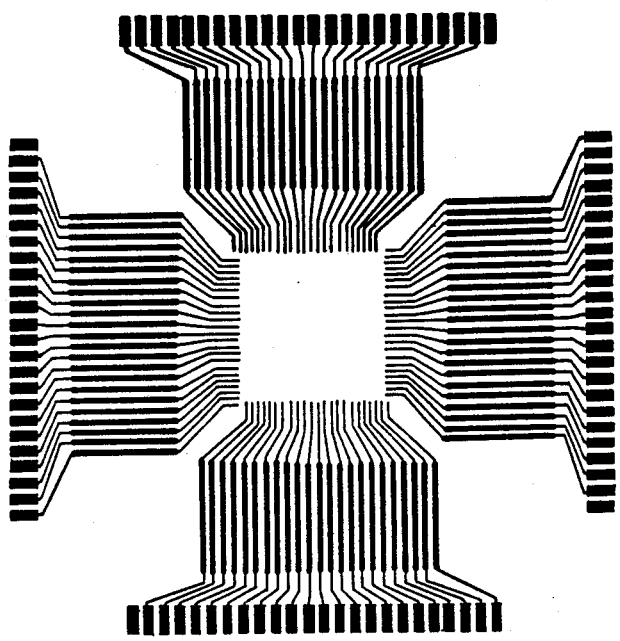
FIG. 4 shows a typical Tape Automated Bonded circuit produceable by the process of this invention.

The method of this Example produces a TAB circuit as shown in FIG. 4 with clean line definition of at least 75-100 μm.

EXAMPLE 10

This Example shows the utility of laminates produced by the present method for a typical semi-additive circuit preparation. In the semi-additive process of circuit preparation a thin layer of copper of up to about 8.0 μm is plated to provide a more highly conductive metal layer to facilitate subsequent electrolytic deposition of copper to a final desired thickness. This initial thin copper layer can be electrolessly or electrolytically deposited on the nickel.

A sample of type VN200 Kapton brand polyimide film is textured and coated with electroless nickel by the procedure of Example 1, and then electrolytically flashed to a thickness of only 3 μm with copper. This copper surface is then cleaned in an alkaline degreasing solution for one minute, followed by 25% HCl containing 0.5% $HNO_3$ for one minute at 25° C., then water rinsed and dried. Riston photopolymer dry film from DuPont is then hot roll laminated to the cleaned surface of the copper, and a TAB circuit (FIG. 4) is imaged through a negative photomask with an ultraviolet light source, and then developed using Riston developer. Riston photopolymer dry film is a negative photoresist, so the areas exposed to ultraviolet (UV) light energy become insoluble in the developing solution. The TAB circuit is then plated to a thickness of about 35 μm in the non-masked areas using a brightened copper sulfate bath. The resist is stripped, and the thin copper/nickel flash is removed in a ferric chloride etching solution.

Good line definitions at 75-100 μm line dimensions again are obtained in the finished circuit. solution.

EXAMPLE 11

Figure 3:
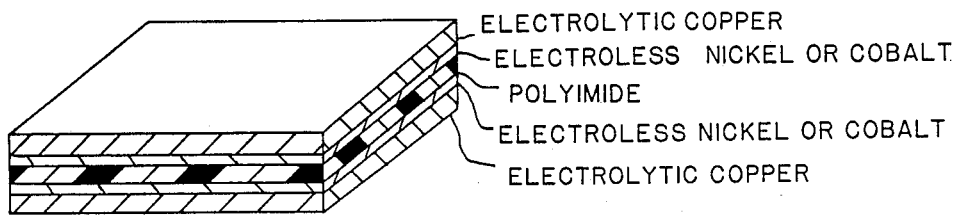
FIG. 3 shows the embodiment of this invention coated on both sides with nickel and copper.

A double-sided copper clad laminate of the type shown in FIG. 3 is prepared by the procedure of Example 1 and tested in accordance with IPC test 2.4.13 as follows:

1. One side of the sample is masked with tape.
2. The metal is then removed from the unmasked side in a copper chloride etchant, and the tape mask is removed.
3. A two inch square is cut from the specimen.
4. The sample is then placed in an oven at 135±5° C. for one hour.
5. The surface is cleaned by the use of an acid flux.
6. The sample is floated for 10 seconds just beneath the surface of molten solder held at 250±10° C.
7. The uncoated side of the sample is then inspected for metal delamination and separation from the polyimide surface.

No areas of delamination were found, and no separation at the metal/polymer interface was observed.

EXAMPLE 12

A four inch by six inch sample of type 200VN Kapton brand polyimide film is textured with a 60% Hydrazine—9.3% Caustic solution as disclosed in Table II of U.S. Pat. No. 4,078,096 to Redmond et al. The textured and visibly frosted sample is then plated in accordance with Example 1 of this application. An average peel strength of only 4.0 lb./in. is obtained for samples prepared in this manner. The bond failure appears to be within the polymer film itself, which is a good indication that the cohesive strength of the film has been reduced.

Figure 6:
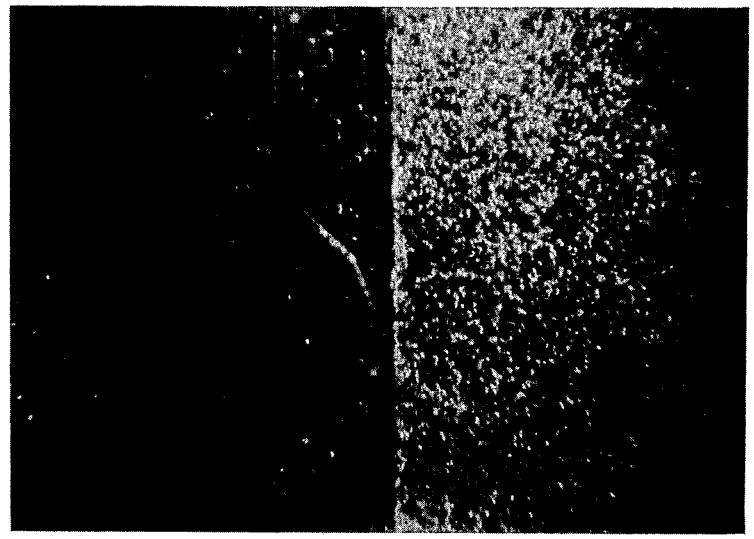
FIG. 6 is a photomicrograph, at 65X magnification, contrasting the textured film made by method of this invention on the right half of the photomicrograph as compared to film treated by the method of Redmond on the left half of the photomicrograph as outlined in Example 12 of this application. (Texturant D of Example 3 vs. Example 12)

As shown by FIG. 6, the Redmond et al treated surface on the left half of the photomicrograph is incompletely and nonuniformly textured. In contrast, the polyimide surface treated in accordance with this invention has a uniformly and completely textured surface as seen in the right half of the photomicrograph.

We claim:

1. A polyimide laminate sheet product including as one layer of said laminate sheet product a polyimide sheet having two surfaces, each of said polyimide sheet surfaces being uniformly and substantially completely textured and each of said polyimide sheet surfaces being free of an adhesive and having a metal coating comprising an electroless nickel or cobalt coating and an electrolytic copper coating bonded to each of said nickel or cobalt coatings, said laminate sheet product having a peel strength of at least 6.0 lb./in. as measured by IPC test 2.4.9 Method A and a peel strength of at least 4.5 lb./in. as measured by IPC test 2.4.9 Method C and being capable of passing IPC test 2.4.13 for solder float.

2. The product of claim 1 wherein said electroless coating is a nickel containing alloy.

3. The product of claim 1 where said electroless nickel or cobalt coating is at least 0.15 μm thick.

4. The product of claim 1 where said electroless metal coating comprises a cobalt containing alloy.

5. The product of any one of claims 1, 2, 3 or 4 wherein each of said metal coatings including copper is patterned.

6. A polyimide laminate sheet product including as one layer of said laminate sheet product a polyimide sheet having two surfaces, at least one of said polyimide sheet surfaces being uniformly and substantially completely textured and one of said polyimide sheet surfaces being uncoated or being uniformly and substantially completely textured and coated with an electroless nickel or cobalt coating, a second surface of said polyimide sheet being uniformly and substantially completely textured and coated with an electroless nickel or cobalt coating directly on said second surface and an electrolytic copper coating on said nickel or cobalt coating, each of said polyimide sheet surfaces coated with a metal being free of an adhesive; the coating on said second surface having a peel strength of at least 6.0 lb./in. as measured by IPC test 2.4.9 Method A and a peel strength of at least 4.5 lb./in. as measured by IPC test 2.4.9 Method C and being capable of passing the IPC test 2.4.13 for solder float.

7. The product of claim 6 wherein said electroless coating is a nickel containing alloy.

8. A product of claim 6 wherein said electroless metal coating is cobalt or a cobalt containing alloy.

9. The product of any one of claims 2, 6, 7 or 8 wherein said metal coating including copper is patterned.

* * * * *